(12) United States Patent
Sosnowski

(10) Patent No.: US 7,451,536 B2
(45) Date of Patent: *Nov. 18, 2008

(54) LANCE-TAB MOUNTING METHOD

(75) Inventor: Anthony M. Sosnowski, Stroudsburg, PA (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/779,760

(22) Filed: Jul. 18, 2007

(65) Prior Publication Data

US 2007/0284141 A1    Dec. 13, 2007

Related U.S. Application Data

(62) Division of application No. 10/943,285, filed on Sep. 17, 2004, now Pat. No. 7,263,756.

(60) Provisional application No. 60/503,831, filed on Sep. 18, 2003.

(51) Int. Cl.
*B23P 11/00* (2006.01)
*H05K 9/00* (2006.01)

(52) U.S. Cl. .............................. 29/446; 29/450; 29/521; 174/354; 174/355

(58) Field of Classification Search .................. 29/446, 29/450, 453, 505, 513, 521, 525.01, 525.14; 174/353, 354, 355, 350, 358; 361/818; 72/379.2, 72/379.6
See application file for complete search history.

(56) References Cited

U.S. PATENT DOCUMENTS

| | | |
|---|---|---|
| 4,061,413 A | 12/1977 | Keller |
| 4,623,752 A | 11/1986 | Steen et al. |
| 5,001,297 A | 3/1991 | Peregrim et al. |
| 5,029,254 A | 7/1991 | Stickney |
| 5,120,903 A | 6/1992 | Tam |
| 5,204,496 A | 4/1993 | Boulay et al. |
| 5,523,527 A | 6/1996 | Mann et al. |
| 5,534,662 A | 7/1996 | Peacock et al. |
| 6,043,991 A | 3/2000 | Sorrentino |
| 6,225,555 B1 | 5/2001 | Sosnowski |
| 6,320,120 B1 | 11/2001 | Van Haaster |
| 6,403,879 B1 | 6/2002 | Clements et al. |
| 6,444,900 B1 | 9/2002 | Casey |

(Continued)

FOREIGN PATENT DOCUMENTS

GB    2184294    6/1987

(Continued)

*Primary Examiner*—Jermie E Cozart
(74) *Attorney, Agent, or Firm*—Harness, Dickey & Pierce, P.L.C.

(57) ABSTRACT

Aspects of the present disclosure provide methods for mounting fingerstock EMI shielding gaskets on sheet metal structures. The fingerstock EMI shielding gasket may include a generally D-shaped cross section with at least one mounting tab forming at least part of an upright portion. In one particular exemplary embodiment, a mounting method generally includes providing a sheet metal structure with inner and outer tabs which protrude outwardly from a surface of the sheet metal structure. The inner tabs may be oriented generally toward the outer tabs and may be laterally separated from the outer tabs. The shielding gasket may be slidably inserted into position longitudinally between the inner and outer tabs.

20 Claims, 12 Drawing Sheets

U.S. PATENT DOCUMENTS

| | | |
|---|---|---|
| 6,483,024 B1 | 11/2002 | Smithson et al. |
| 6,525,266 B2 | 2/2003 | Ferland et al. |
| 6,547,607 B2 | 4/2003 | Moll et al. |
| 6,639,147 B2 | 10/2003 | Thompson et al. |
| 6,744,641 B2 | 6/2004 | Schnabel |
| 6,774,301 B1 | 8/2004 | Kordes et al. |
| 6,946,598 B1 | 9/2005 | Konshak |
| 7,263,756 B2 * | 9/2007 | Sosnowski .................. 29/446 |

FOREIGN PATENT DOCUMENTS

WO    WO 2005/029938    3/2005

* cited by examiner

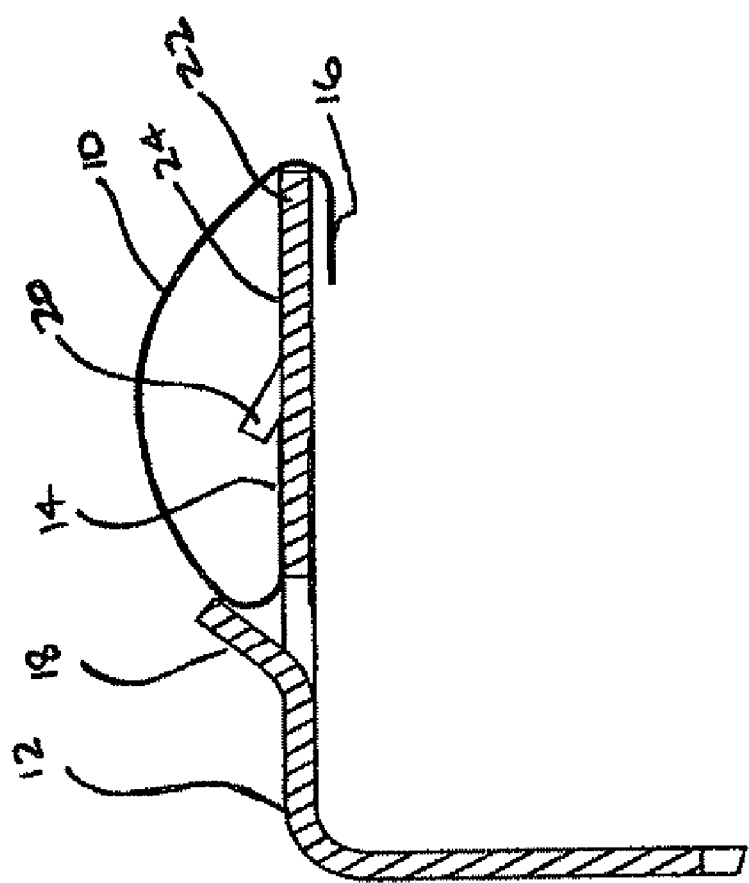

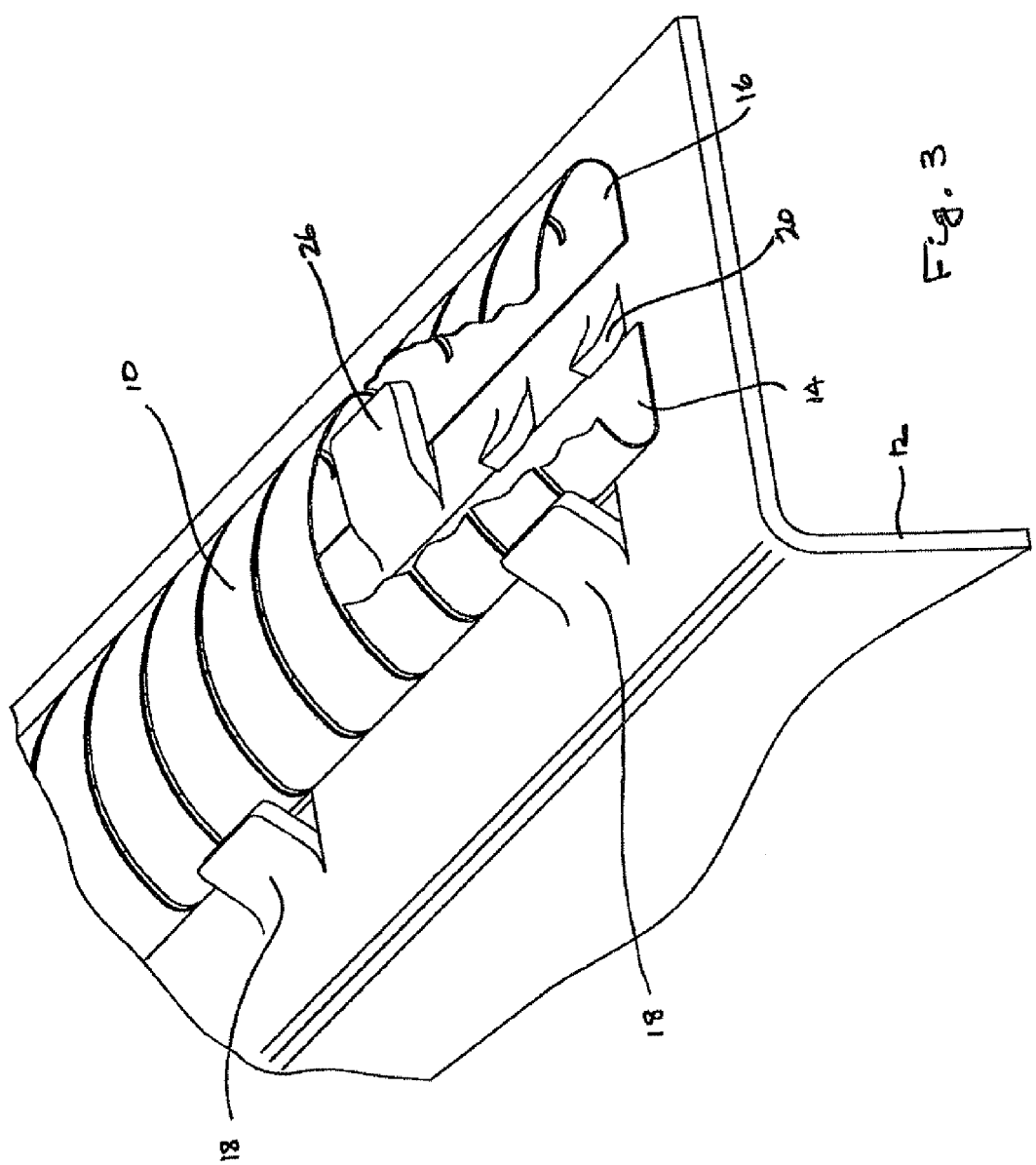

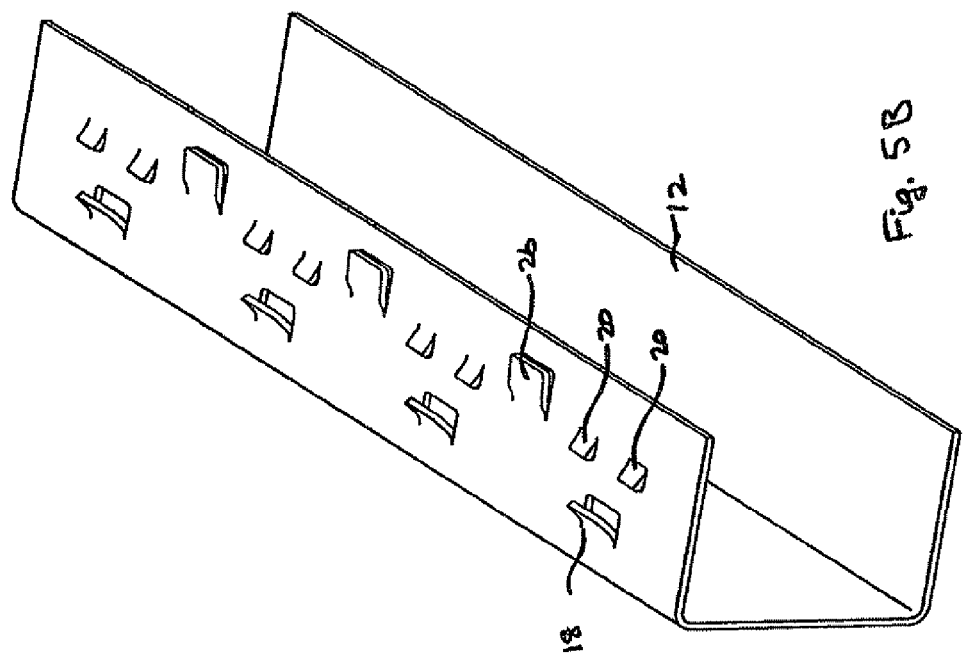
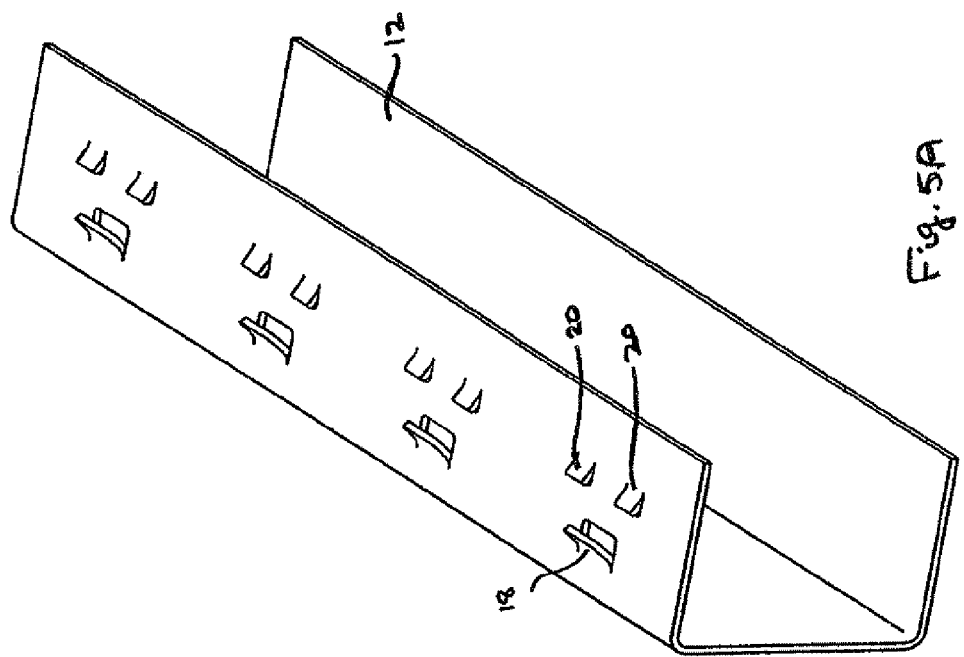

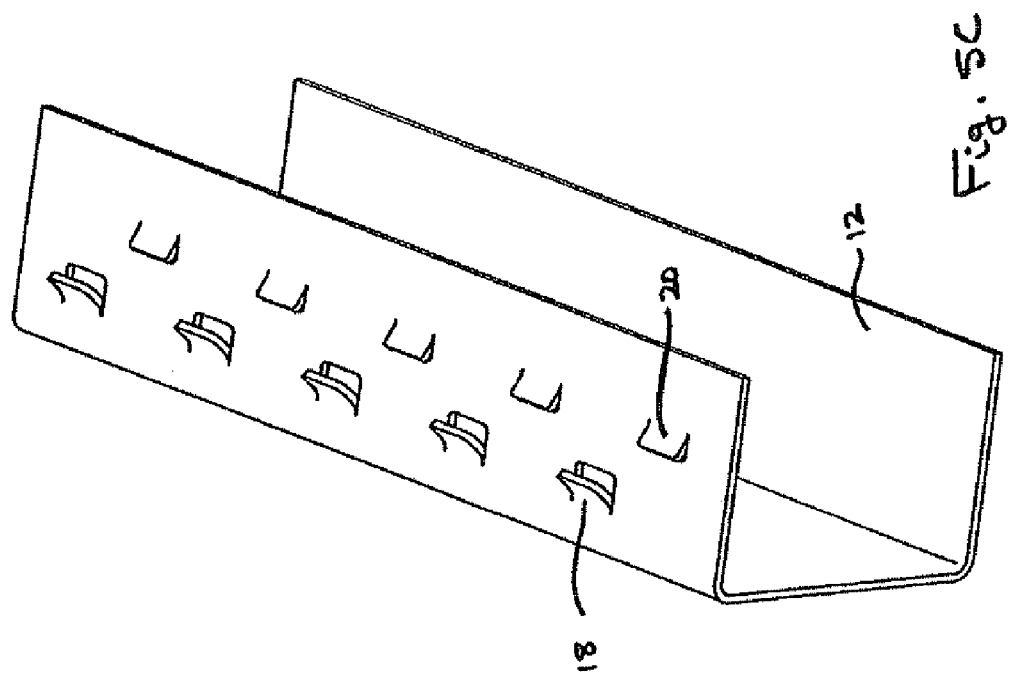

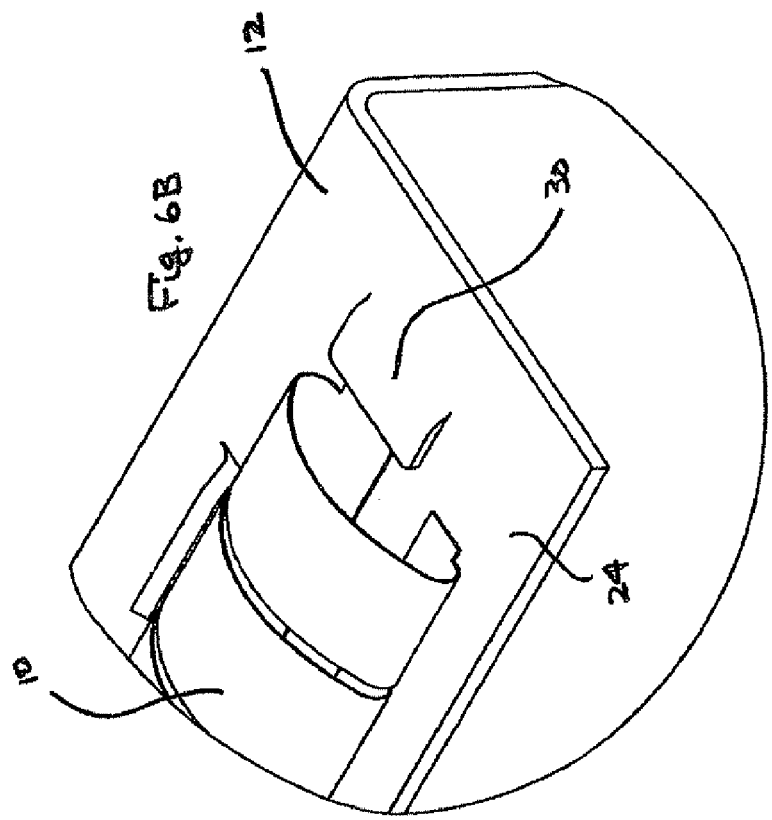
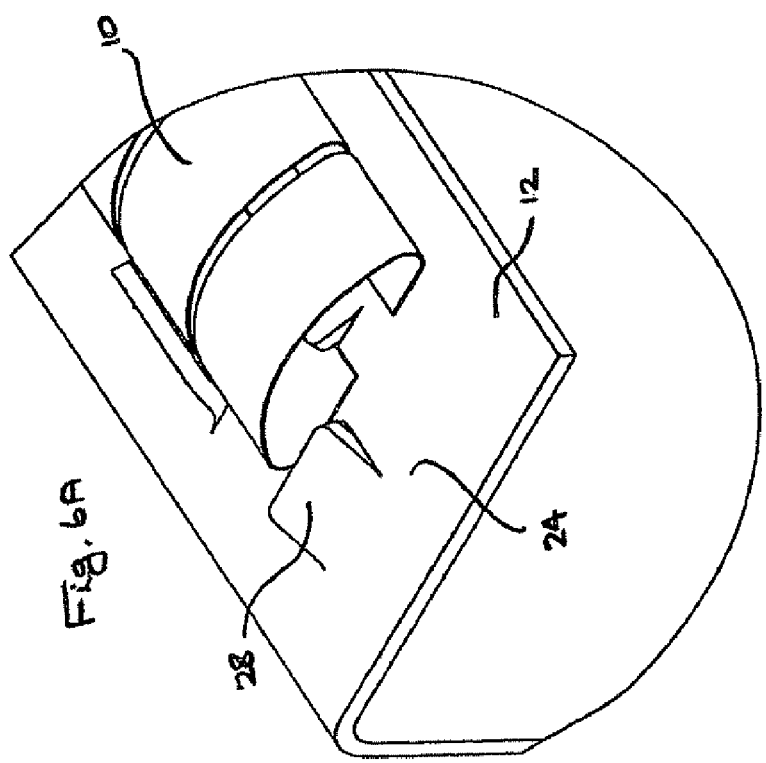

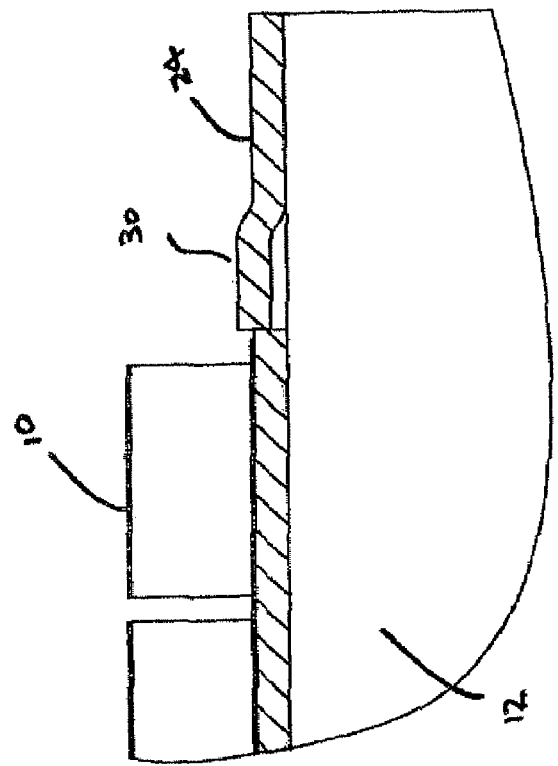
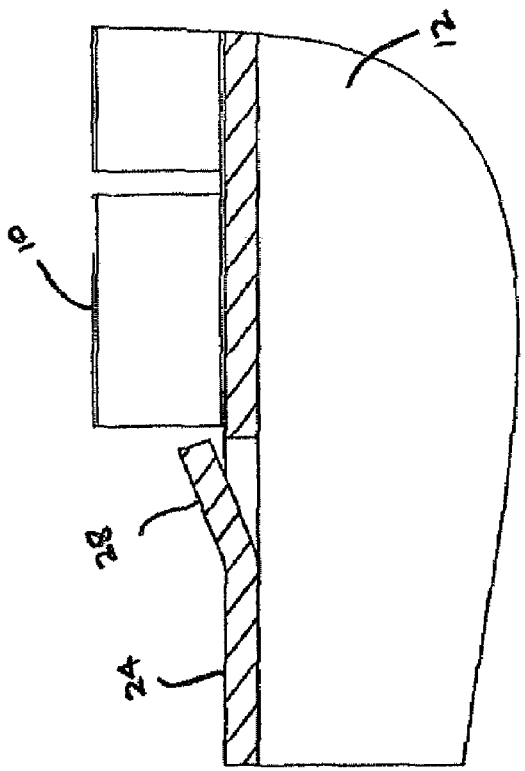
Fig. 7B
Fig. 7A

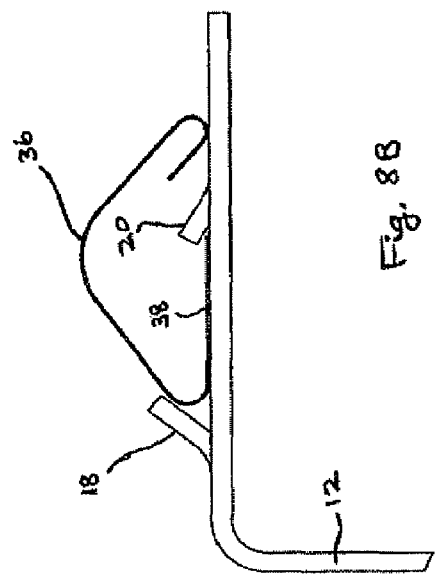
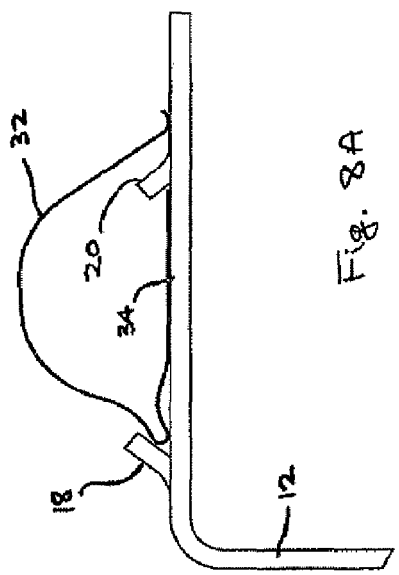
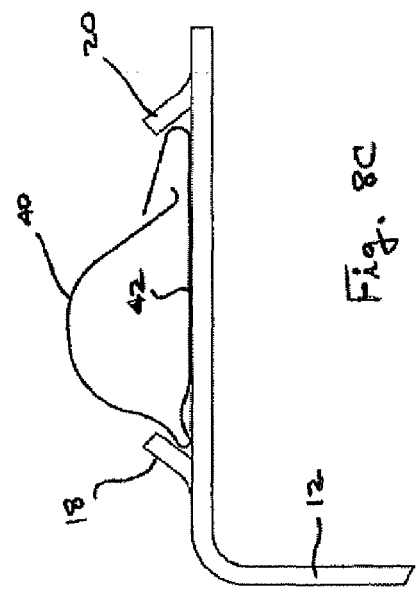

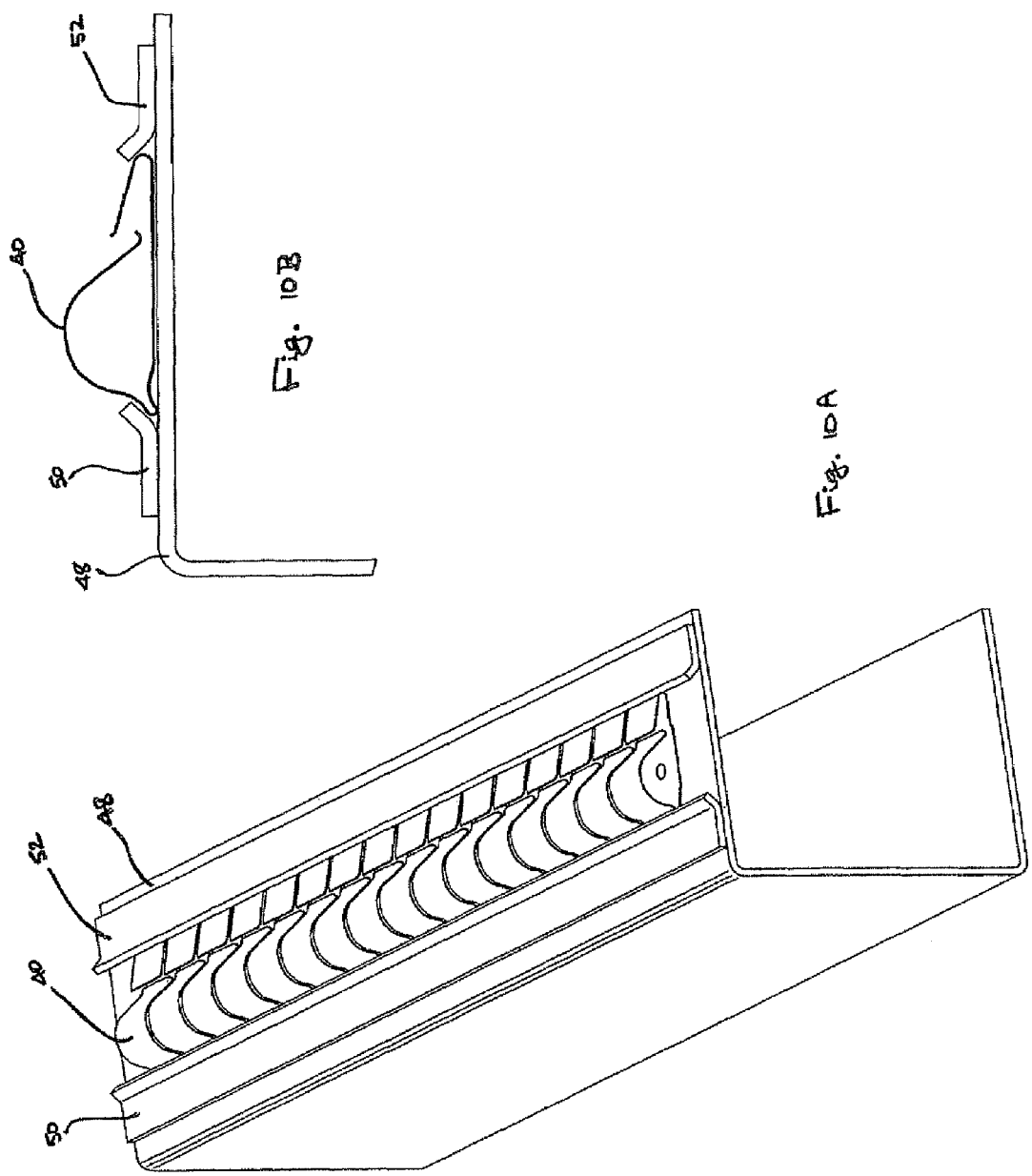

LANCE-TAB MOUNTING METHOD

CROSS-REFERENCE TO RELATED APPLICATIONS

This application is a divisional of U.S. patent application Ser. No. 10/943,285 filed Sep. 17, 2004, now U.S. Pat. No. 7,263,756 which claims the benefit of U.S. Provisional Patent Application No. 60/503,831 filed Sep. 18, 2003. The disclosures of the above applications are incorporated herein by reference.

FIELD

The present disclosure relates generally to the provision of EMI shielding, and more specifically, to mounting fingerstock EMI shielding gaskets on sheet metal structures.

BACKGROUND

The statements in this section merely provide background information related to the present disclosure and may not constitute prior art.

Fingerstock EMI shielding gaskets are commonly mounted for either wiping or compression closing applications on structures used to house circuit boards, such as those designed to plug into a rack for electronic equipment. Fingerstock gaskets have been mounted in a variety of ways. In one existing method, double-sided, pressure-sensitive adhesive (PSA) tape is used to hold the gasket in a desired position on the structure. Alternatively, rivets or mounting tracks, both of which include fastening means designed to engage into holes drilled or otherwise provided in the structure of interest, may be used. Finally, the gaskets may also be inserted into slots in the structure, clipped onto an edge of the structure, or welded or soldered into the position desired.

As used herein, the term electromagnetic interference (EMI) should be considered to generally include and refer to both electromagnetic interference (EMI) and radio frequency interference (RFI) emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

SUMMARY

According to various aspects, the present disclosure provides methods for mounting fingerstock EMI shielding gaskets on sheet metal structures. The fingerstock EMI shielding gasket may include a generally D-shaped cross section with at least one mounting tab forming at least part of an upright portion. In one particular exemplary embodiment, a method generally includes providing a sheet metal structure with inner and outer tabs which protrude outwardly from a surface of the sheet metal structure. The inner tabs may be oriented generally toward the outer tabs and may be laterally separated from the outer tabs. The fingerstock EMI shielding gasket may be slidably inserted into position longitudinally between the inner and outer tabs.

Another exemplary embodiment provides a method for mounting a fingerstock EMI shielding gasket on a sheet metal structure. The fingerstock EMI shielding gasket has a generally D-shaped cross section with at least one mounting tab forming at least part of an upright portion thereof. The method generally includes attaching at least one outer tab to a sheet metal structure such that the at least one outer tab protrudes outwardly from a surface of the sheet metal structure, and attaching at least one inner tab to the sheet metal structure such that the at least one inner tab protrudes outwardly from the surface of the sheet metal structure. The at least one inner tab may be oriented generally toward the at least one outer tab and be laterally separated therefrom. The method may also include sliding the fingerstock EMI shielding gasket longitudinally between the at least one inner tab and the at least one outer tab with the at least one mounting tab of the fingerstock EMI shielding gasket being positioned beneath the at least one inner tab thereby securing the fingerstock EMI shielding gasket generally between the at least one inner tab and the at least one outer tab.

A further exemplary embodiment provides a method for mounting a fingerstock EMI shielding gasket on a sheet metal structure. The fingerstock EMI shielding gasket has a generally D-shaped cross section with at least one mounting tab forming at least part of an upright portion thereof. Inner and outer tabs are attached to and protrude outwardly from the sheet metal structure. The inner and outer tabs are laterally separated and aligned longitudinally in a direction parallel to an edge of the sheet metal structure. In this embodiment, the method generally includes sliding the fingerstock EMI shielding gasket longitudinally between the inner and outer tabs with the at least one mounting tab of the fingerstock EMI shielding gasket being positioned beneath at least one inner tab of the sheet metal structure, thereby securing the fingerstock EMI shielding gasket generally between the inner and outer tabs of the sheet metal structure.

In another exemplary embodiment, a system generally includes a sheet metal structure and a fingerstock EMI shielding gasket. Inner and outer tabs protrude outwardly from a surface of the sheet metal structure. The inner and outer tabs are laterally separated and aligned longitudinally in a direction parallel to an edge of the sheet metal structure. The fingerstock EMI shielding gasket has a generally D-shaped cross section with at least one mounting tab forming at least part of an upright portion thereof. The fingerstock EMI shielding gasket may be positioned generally between the inner and outer tabs with the at least one mounting tab of the fingerstock EMI shielding gasket beneath at least one inner tab of the sheet metal structure, thereby securing the fingerstock EMI shielding gasket generally between the inner and outer tabs of the sheet metal structure.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 2 is a cross-sectional view showing an exemplary gasket mounted on a structure according to an alternative method of the present disclosure;

FIG. 3 is a perspective view of the gasket shown in FIG. 1 with a portion partially cut away;

FIGS. 5A through 5E are perspective views showing several alternative schemes by which a structure may be provided with outer tabs, inner tabs, and anti-snag tabs according to exemplary embodiments;

FIGS. 6A and 6B are perspective views of end portions of structures with gaskets held in position by longitudinal-retention tabs that inhibit the gaskets from shifting longitudinally out of position according to exemplary embodiments;

FIGS. 7A and 7B are cross-sectional side views of the end portions shown in FIGS. 6A and 6B, respectively;

FIGS. 8A through 8C are end views showing the mounting of alternative embodiments of fingerstock gaskets;

FIGS. 10A and 10B are perspective and end views, respectively, of an exemplary gasket mounted on a structure in another embodiment.

DETAILED DESCRIPTION

Figure 1:
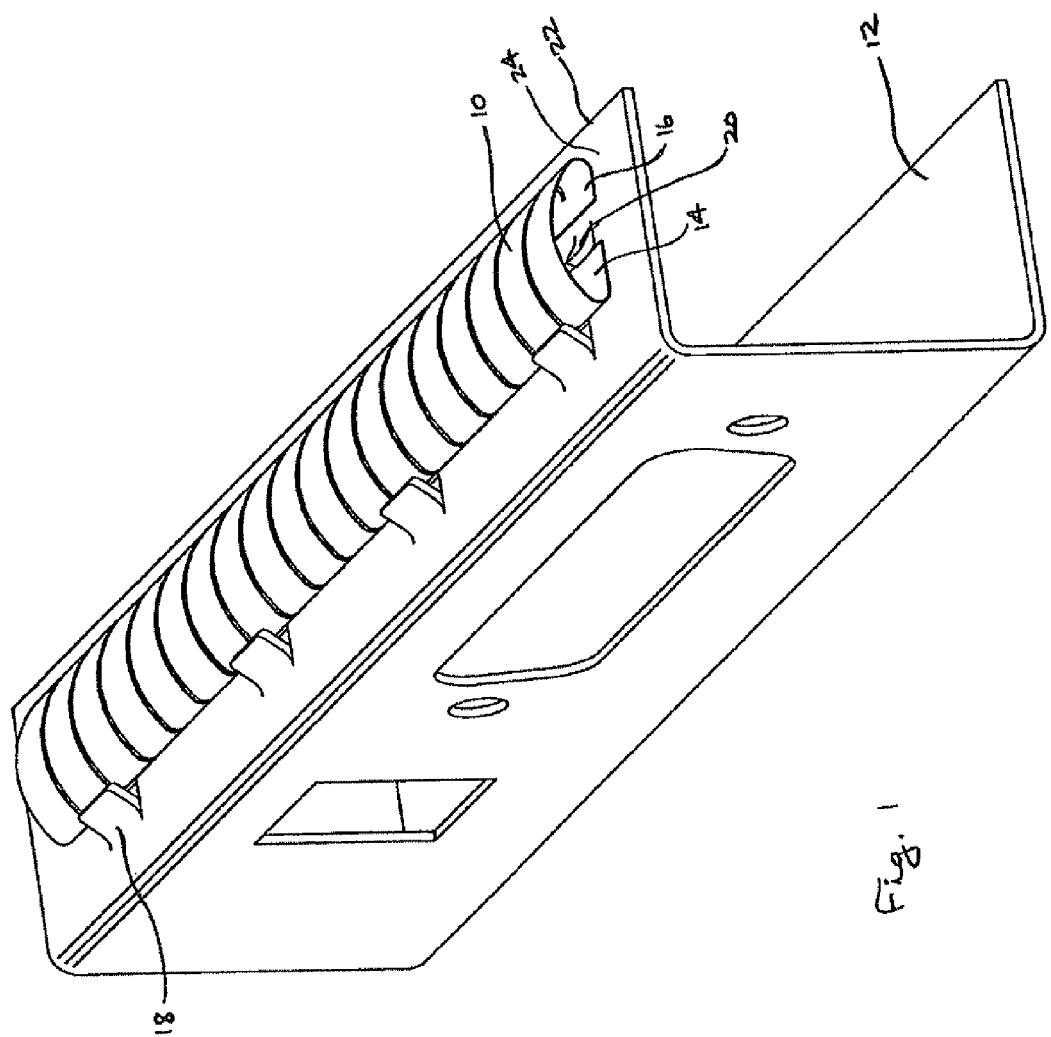
FIG. 1 is a perspective view of an exemplary gasket mounted on a structure in accordance with an exemplary method of the present disclosure.

The following description is merely exemplary in nature and is not intended to limit the present disclosure, application, or uses. It should be understood that throughout the drawings, corresponding reference numerals indicate like or corresponding parts and features.

Accordingly, aspects of the present disclosure provide methods for mounting fingerstock EMI shielding gaskets on sheet metal structures. In various exemplary embodiments, a shielding gasket includes a generally D-shaped cross section with at least one mounting tab forming at least part of an upright portion. In one particular exemplary embodiment, a mounting method generally includes forming (e.g., integrally forming, attaching, etc.) at least one outer tab and at least one inner tab that protrude outwardly from a surface of a sheet metal structure. The inner tabs are oriented generally toward the outer tabs and are laterally separated from the outer tabs. The shielding gasket may be slid longitudinally between the inner and outer tabs such that one of the gasket's two mounting tabs is inserted beneath the inner tabs, to thereby be secured between the inner and outer tabs.

In some exemplary embodiments, a plurality of outer tabs and a plurality of inner tabs are aligned longitudinally in a direction parallel to an edge of the sheet metal structure. A second mounting tab of the shielding gasket may be directed beneath the edge of the sheet metal structure, or it may reside on the surface of the sheet metal structure. Alternative embodiments may include anti-snag tabs that also protrude outwardly from a surface of the sheet metal structure. The anti-snag tabs may be formed to hold the second mounting tab of the shielding gasket down on the surface of the sheet metal structure to prevent (or at least inhibit) snagging.

Moreover, some exemplary embodiments may include longitudinal-retention tabs that protrude partially or completely from the surface of the sheet metal structure. The longitudinal-retention tabs may be provided to prevent (or at least inhibit) the shielding gasket from shifting longitudinally out of position once it is slid between the inner and outer tabs.

Turning now to the figures, FIG. 1 is a perspective view of a fingerstock gasket 10 mounted on a structure 12 designed to hold a circuit board or other component of a piece of electronic equipment. The fingerstock gasket 10 may be made of any of a variety of electrically-conducting materials or materials rendered electrically conductive. When installed or mounted, the fingerstock gasket 10 may be useful in providing EMI shielding when the structure 12 closely abuts against another component or structure in the piece of electronic equipment, with the gasket 10 being compressed between the two and closing the gap between them against leakage of electromagnetic fields from within the equipment. The description and figures are intended to show the mounting of the fingerstock gasket 10 in accordance with embodiments of the present disclosure, and not the specifics of each and every conceivable situation in which the gasket 10 may find use.

In accordance with aspects of the present disclosure, the fingerstock gasket 10 is mounted using tabs formed from the material from which the structure 12 is made (e.g., sheet metal, etc.). As shown in FIG. 1, the fingerstock gasket 10 has a generally D-shaped cross section with two mounting tabs 14, 16.

In the illustrated embodiment of FIG. 1, outer tabs 18 and inner tabs 20 are integrally formed from the structure 12 itself. The outer tabs 18 and inner tabs 20 are preferably stamped and formed from structure 12. Alternatively, the tabs 18, 20 may be produced by other suitable methods, such as casting (e.g., die-casting, etc.) or molding. As will be made more apparent in subsequent figures, the fingerstock gasket 10 may be mounted into position on structure 12 by sliding longitudinally therealong with the gasket's mounting tab 14 captured generally between the outer and inner tabs 18, 20. The outer tab 18 can also serve as a down stop.

FIG. 2 is a cross-sectional view showing an alternative method for mounting the fingerstock gasket 10. As shown in FIG. 2, the gasket's mounting tab 16 is wrapped around and under an edge 22 of the structure 12, as compared to FIG. 1 in which the gasket's mounting tab 16 is shown resting on the surface 24 of the structure 12.

FIG. 3 is a perspective view in which a portion of the gasket 10 is partially cut away to show inner tabs 20 and an anti-snag tab 26. The gasket's mounting tab 14 is shown captured generally between the outer and inner tabs 18, 20. In addition, the gasket's mounting tab 16 is shown to be secured under anti-snag tab 26. In this particular embodiment, the anti-snag tab 26 is also integrally formed (e.g., stamped, molded, etc.) from the structure 12 itself. For example, the anti-snag tab 26 may be stamped and formed from the structure 12, although the anti-snag tab 26 may alternatively be produced by casting (e.g., die-casting, etc.) or by molding. The anti-snag tab 26 is so called because it holds the gasket's mounting tab 16 securely and prevents (or at least inhibits) snagging as structure 12 is being mounted in a piece of electronic equipment. In this embodiment shown in FIG. 3, the fingerstock gasket 10 may be mounted into position on structure 12 by sliding the gasket 10 longitudinally along the structure 12 so as to capture the gasket's mounting tab 14 generally between the outer and inner tabs 18, 20 and so that the gasket's mounting tab 16 disposed under anti-snag tab or tabs 26.

Figure 4A:
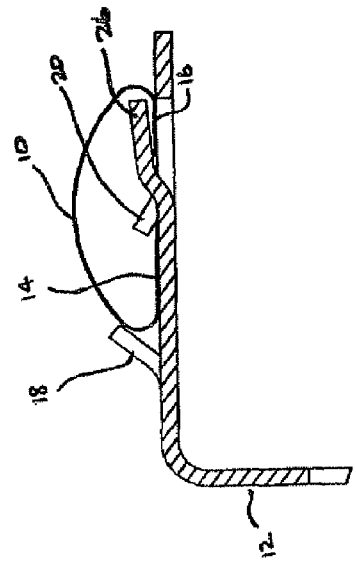
FIGS. 4A through 4D are views of the gasket shown in FIG. 1 in relation to the outer tabs, inner tabs, and anti-snag tabs according to exemplary embodiments.
Figure 4B:
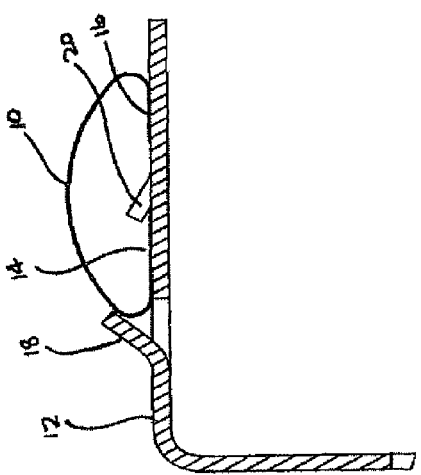
Figure 4C:
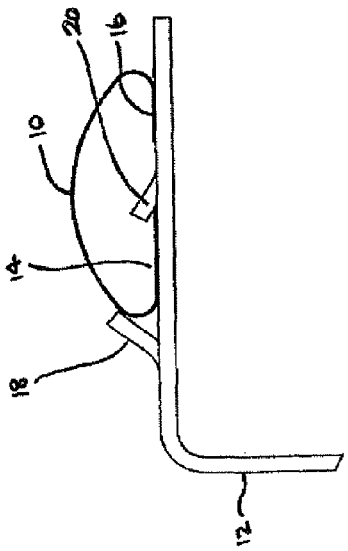
Figure 4D:
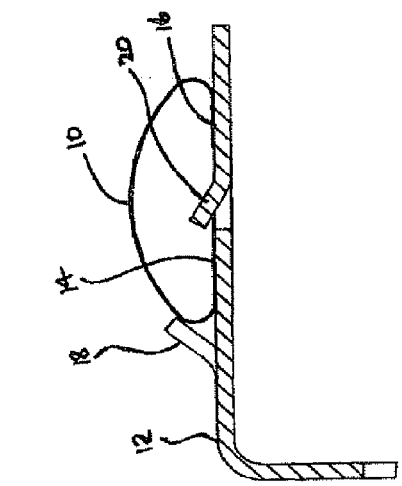

FIGS. 4A through 4D are views showing the gasket 10 and its mounting tabs 14,16 in relation to the outer tab 18, inner tab 20, and anti-snag tab 26 of the structure 12. FIG. 4A is a cross-sectional view taken through one of the outer tabs 18. FIG. 4B is a cross-sectional view taken through one of the inner tabs 20. FIG. 4C is an end view. In FIGS. 4A through 4C, the mounting tab 14 of gasket 10 can be seen to be captured between an outer tab 18 and an inner tab 20. FIG. 4D is a cross-sectional view of the embodiment shown in FIG. 3 taken through an anti-snag tab 26. In addition to showing the capturing of the gasket's mounting tab 14 generally between outer tab 18 and inner tab 20, FIG. 4D also shows the mounting tab 16 of gasket 10 held relatively securely by anti-snag tab 26.

Figure 5E:
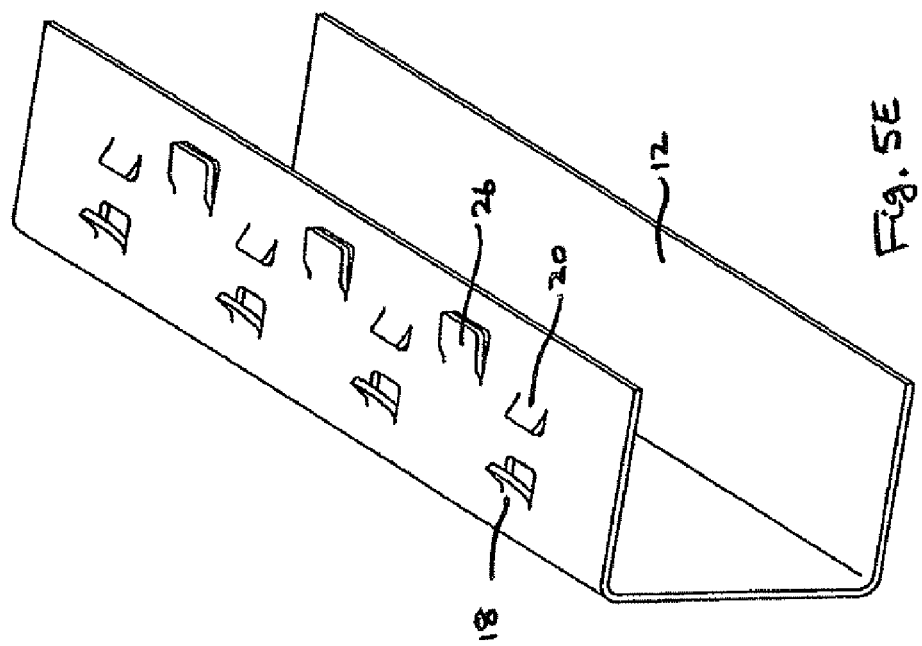

FIGS. 5A through 5E are perspective views showing several alternative schemes by which a structure 12 may be provided with outer tabs 18, inner tabs 20, and anti-snag tabs 26 according to exemplary embodiments. FIG. 5A shows a scheme preferred for relatively short lengths of gasket 10. In this scheme, each outer tab 18 faces a pair of inner tabs 20.

In FIG. 5B, the outer tabs 18 and inner tabs 20 are disposed as in FIG. 5A. But an anti-snag tab 26 is also disposed between each pair of inner tabs 20.

Figure 5D:
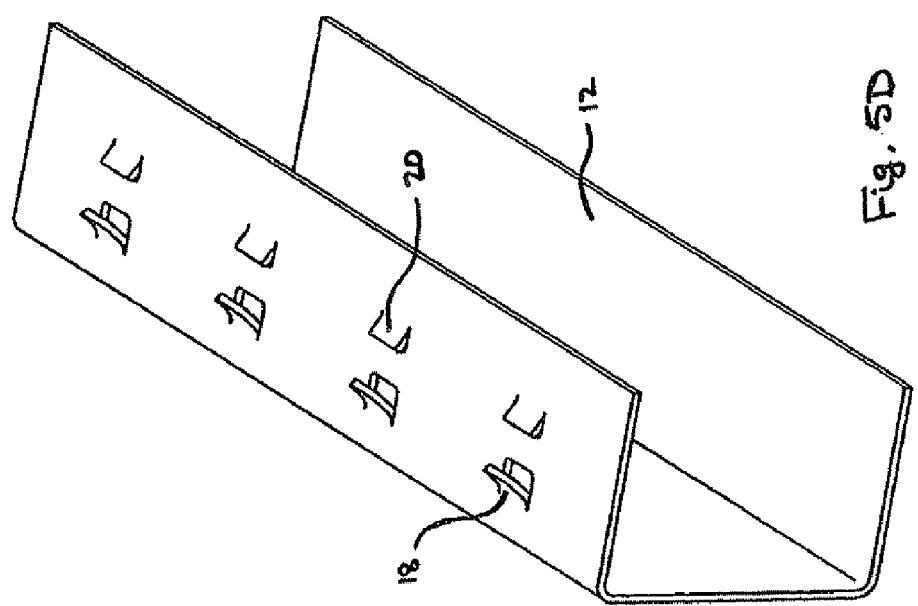

FIGS. 5C and 5D show exemplary schemes having the same numbers of outer tabs 18 and inner tabs 20. In FIG. 5C, the outer tabs 18 and inner tabs 20 are in staggered positions relative to one another. In FIG. 5D, the outer tabs 18 and inner tabs 20 are aligned with one another.

FIG. 5E shows an exemplary scheme wherein anti-snag tabs 26 are disposed between the inner tabs 20. This may also be done with the exemplary scheme shown in FIG. 5C to provide anti-snag tabs 26 between the inner tabs 20.

In all of the exemplary schemes shown in FIGS. 5A though 5E, the outer tabs 18 are all preferably longitudinally aligned on the structure 12. The same can be said for the inner tabs 20 and any anti-snag tabs 26 that may be present. This longitudinal alignment preferably ensures that the gasket 10 may be longitudinally slid into position on the structure 12.

FIGS. 6A and 6B are perspective views of end portions of structures 12 with fingerstock gaskets 10 held in position against longitudinal movement by longitudinal-retention tabs 28, 30. In this particular embodiment, the longitudinal-retention tabs 28, 30 are stamped and formed from structure 12. As shown in FIG. 6A, the longitudinal-retention tab 28 is fully sheared and protrudes completely above the surface 24 of the structure 12. In FIG. 6B, the longitudinal-retention tab 30 is only partially sheared and protrudes less than its full thickness above the surface 24 of the structure 12.

FIGS. 7A and 7B are side views of the end portions shown in FIGS. 6A and 6B, respectively. The difference between longitudinal-retention tab 28 (which is fully sheared and protrudes completely above the surface 24 of the structure 12) and longitudinal-retention tab 30 (which is only partially sheared and protrudes less than its full thickness above the surface 24 of the structure 12) is readily apparent in FIGS. 7A and 7B. Alternatively, any one or more of the longitudinal-retention tabs 28, 30 may be produced by other methods, such as by casting (e.g., die-casting, etc.) or by molding.

FIGS. 8A through 8C are end views showing the mounting of alternative embodiments of fingerstock gaskets. In each of FIGS. 8A through 8C, the structure 12 is again provided with outer tabs 18 and inner tabs 20.

With continued reference to FIG. 8A, the gasket 32 may be an all-purpose fingerstock gasket available from Laird Technologies, Inc. of Delaware Water Gap, Pa., United States of America (e.g., Series 97-540, etc.). The gasket 32 is shown mounted generally between outer and inner tabs 18, 20. In FIG. 8A, the gasket 32 has only one mounting tab 34, as compared to the symmetrical design of gasket 10 shown in FIG. 1 and described above.

With reference now to FIG. 8B, there is shown a gasket 36. The gasket 36 may be a no-snag fingerstock gasket available from Laird Technologies, Inc. As shown in FIG. 8B, the gasket 36 is mounted generally between outer and inner tabs 18, 20. The gasket 36 also has only one mounting tab 38.

FIG. 8C shows a gasket 40, which may be a foldover-series fingerstock gasket available from Laird Technologies, Inc. As shown in FIG. 8C, the gasket 40 has only one mounting tab 42, which is folded back and captured generally between the outer tab 18 and the inner tab 20.

Figure 9B:
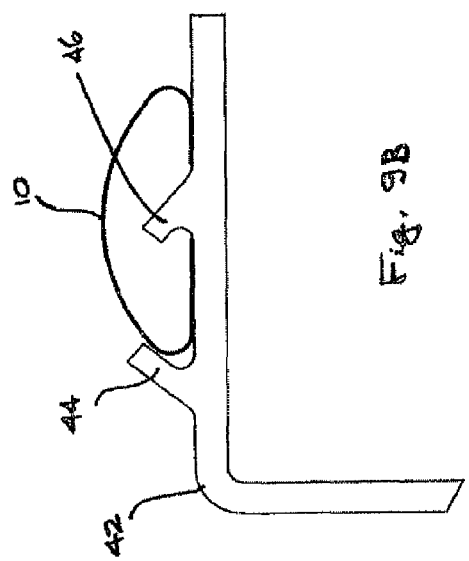
FIGS. 9A and 9B are perspective and end views, respectively, of an exemplary gasket mounted on a structure in an alternate embodiment.
Figure 9A:
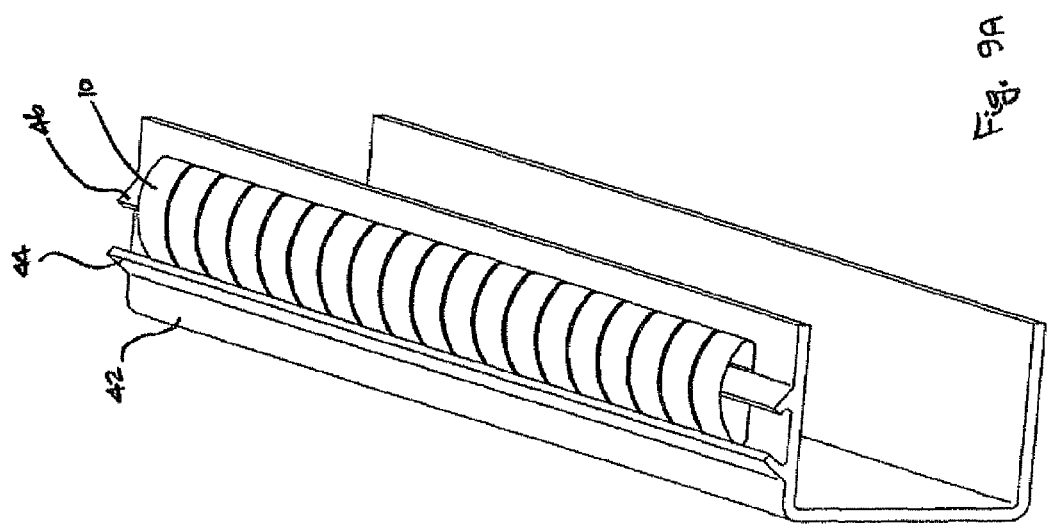

FIGS. 9A and 9B are perspective and end views, respectively, of a gasket 10 mounted on a structure 42. The structure 42 has outer tabs 44 and inner tabs 46 which are integrally formed therewith, for example, by extrusion, casting, etc. In some embodiments, integrally producing tabs 44, 46 by extrusion or casting allows for improved shielding because tabs 44, 46 do not leave apertures in the structure 42.

FIGS. 10A and 10B are perspective and end views, respectively, of a gasket 40 mounted on a structure 48. In this illustrated embodiment, the outer tabs 50 and inner tabs 52 are not integrally formed with the structure 48. Rather, the tabs 50 and 52 are formed from additional pieces that are attached to the structure 48. By forming the tabs 50 and 52 in this exemplary manner, shielding may be improved because tabs 50, 52 do not leave apertures in the structure 48.

With continued reference to FIGS. 10A and 10B, the outer tabs 50 and inner tabs 52 are typically made from sheet metal, and are attached to structure 48 by welding, soldering, adhesives, fasteners (e.g., screws, rivets, etc.), etc. The outer tabs 50 and/or inner tabs 52 may be full-length, like the tabs 44, 46 (e.g., extruded tabs, etc.) shown in FIGS. 9A and 9B. But the outer tabs 50 and/or inner tabs 52 may be segmented, like the tabs (e.g., punched tabs, etc.) shown in FIGS. 1 through 8C. In the illustrated embodiment of FIGS. 10A and 10B, the outer and inner tabs 50, 52 need not be formed or made of an electrically-conductive material. For example, the outer tabs 50 and/or inner tabs 52 may be molded from plastic or other suitable electrically-conductive material or dielectric material.

Embodiments of the present disclosure may have one or more distinct advantages over some existing mounting methods. For example, adhesive tape is not required to secure the fingerstock gaskets, and, as a consequence, no residue from the adhesive tape must be removed from the sheet metal structure if the gaskets have to be replaced. Further, embodiments disclosed herein allow for positioning of the gaskets in a repeatable and accurate manner that does not depend on operator skill. Moreover, embodiments disclosed herein also allow the cost of the gasket to be less than those used in existing track-mounted gaskets. In addition, the tabs on the structures as disclosed herein may be smaller than the slot-mount openings used in existing products, where the smaller openings tend to leak less electromagnetic radiation. Plus, the underside of the structure may be sealed against leakage, for example, with metal foil tape, since the tabs in embodiments disclosed herein do not protrude through the underside of the structure.

Certain terminology is used herein for purposes of reference only, and thus is not intended to be limiting. For example, terms such as "upper," "lower," "above," "below," "top," "bottom," "upward," "downward," "upwardly," and "downwardly" refer to directions in the drawings to which reference is made. Terms such as "front," "back," "rear," "bottom," and "side," describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second," and other such numerical terms referring to structures do not imply a sequence or order unless clearly indicated by the context.

When introducing elements or features and the exemplary embodiments, the articles "a," "an," "the," and "the" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A method for mounting a fingerstock EMI shielding gasket on a sheet metal structure, the fingerstock EMI shielding gasket having a generally D-shaped cross section with at least one mounting tab forming at least part of an upright portion thereof, the method comprising:
    attaching at least one outer tab to a sheet metal structure such that the at least one outer tab protrudes outwardly from a surface of the sheet metal structure;
    attaching at least one inner tab to the sheet metal structure such that the at least one inner tab protrudes outwardly from the surface of the sheet metal structure, the at least one inner tab being oriented generally toward the at least one outer tab and being laterally separated therefrom; and
    sliding the fingerstock EMI shielding gasket longitudinally between the at least one inner tab and the at least one outer tab with the at least one mounting tab of the fingerstock EMI shielding gasket being positioned beneath the at least one inner tab thereby securing the fingerstock EMI shielding gasket generally between the at least one inner tab and the at least one outer tab.

2. The method of claim 1, wherein attaching includes using at least one or more of welding, soldering, adhesive, and fasteners.

3. The method of claim 1, wherein the sheet metal structure further comprises at least one longitudinal-retention tab protruding outwardly from a surface of the sheet metal structure and being oriented laterally relative to the inner and outer tabs such that the fingerstock EMI shielding gasket may be secured against longitudinal movement between the inner and outer tabs.

4. The method of claim 3, wherein the at least one longitudinal-retention tab protrudes completely above the surface of the sheet metal structure.

5. The method of claim 3, wherein the at least one longitudinal-retention tab protrudes less than its full thickness above the surface of the sheet metal structure.

6. The method of claim 1, wherein the fingerstock EMI shielding gasket includes a second mounting tab, the second mounting tab forming part of an upright portion of the generally D-shaped cross section, and wherein the sheet metal structure further includes at least one anti-snag tab oriented in the same general direction as the at least one outer tab, the at least one anti-snag tab being laterally separated from the inner and outer tabs and laterally farther from the at least one outer tab than from the at least one inner tab, and wherein sliding includes positioning the second mounting tab of the fingerstock EMI shielding gasket generally beneath the at least one anti-snag tab, whereby the anti-snag tab helps hold the second mounting tab down on the surface of the sheet metal structure.

7. The method of claim 1, wherein the sheet metal structure is provided with the inner and outer tabs without leaving apertures in the sheet metal structure.

8. The method of claim 1, wherein two or more outer tabs are attached to the sheet metal structure such that the two or more outer tabs are aligned longitudinally in a direction parallel to an edge of the sheet metal structure.

9. The method of claim 1, wherein two or more inner tabs are attached to the sheet metal structure such that the two or more inner tabs are aligned longitudinally in a direction parallel to an edge of the sheet metal structure.

10. The method of claim 1, wherein the inner and outer tabs are in staggered positions longitudinally along the sheet metal structure.

11. The method of claim 1, wherein the inner and outer tabs are aligned laterally with one another.

12. The method of claim 1, wherein the fingerstock EMI shielding gasket includes a second mounting tab, the second mounting tab forming part of an upright portion of the generally D-shaped cross section, and wherein sliding includes:
    directing the second mounting tab of the fingerstock EMI shielding beneath an edge of the sheet metal structure; or
    positioning the second mounting tab of the fingerstock EMI shielding gasket on a surface of the sheet metal structure.

13. A method for mounting a fingerstock EMI shielding gasket on a sheet metal structure, the shielding gasket having a generally D-shaped cross section with at least one mounting tab forming at least part of an upright portion thereof, the method comprising:
    providing at least one outer tab that protrudes outwardly from a surface of the sheet metal structure; and
    providing at least one inner tab that protrudes outwardly from the surface of the sheet metal structure, the inner tab being oriented generally toward the outer tab and being laterally separated therefrom so as to allow sliding of the fingerstock EMI gasket longitudinally between the inner and outer tabs with the at least one mounting tab of the fingerstock EMI shielding gasket being positioned beneath the at least one inner tab of the sheet metal structure, to thereby secure the fingerstock EMI shielding gasket generally between the inner and outer tabs of the sheet metal structure.

14. The method of claim 13, further comprising sliding the fingerstock EMI shielding gasket longitudinally between the inner and outer tabs with the at least one mounting tab of the fingerstock EMI shielding gasket being positioned beneath the at least one inner tab of the sheet metal structure, thereby securing the fingerstock EMI shielding gasket generally between the inner and outer tabs of the sheet metal structure.

15. The method of claim 13, wherein the fingerstock EMI shielding gasket includes a second mounting tab forming part of an upright portion of the generally D-shaped cross section, and wherein the method further comprises providing at least one anti-snag tab that protrudes outwardly from the sheet metal structure, the anti-snag tab being aligned longitudinally in a direction parallel to an edge of the sheet metal structure, the anti-snag tab being oriented in the same direction as the at least one outer tab and being laterally separated from the inner and outer tabs and laterally farther from the at least one outer tab than from the at least one inner tab, the anti-snag tab being configured to allow positioning of the second mounting tab of the fingerstock EMI shielding gasket generally beneath the at least one anti-snag tab, whereby the anti-snag tab helps hold the second mounting tab down on the surface of the sheet metal structure.

16. The method of claim 13, further comprising providing at least one longitudinal-retention tab that protrudes upwardly from the sheet metal structure, the at least one longitudinal-retention tab being oriented laterally relative to the inner and outer tabs so that the fingerstock EMI shielding gasket may be secured against longitudinal movement between the inner and outer tabs.

17. A method for mounting a fingerstock EMI shielding gasket on a sheet metal structure, the shielding gasket having a generally D-shaped cross section with at least one mounting tab forming at least part of an upright portion thereof, the method comprising:

providing at least one outer tab that protrudes outwardly from a surface of the sheet metal structure; and providing at least one inner tab that protrudes outwardly from the surface of the sheet metal structure, the inner tab being oriented generally toward the outer tab and being laterally separated therefrom so as to allow sliding of the fingerstock EMI gasket longitudinally between the inner and outer tabs with the at least one mounting tab of the fingerstock EMI shielding gasket being positioned beneath the at least one inner tab of the sheet metal structure, to thereby secure the fingerstock EMI shielding gasket generally between the inner and outer tabs of the sheet metal structure;

wherein the sheet metal structure is provided by attaching the inner and outer tabs to the sheet metal structure and without leaving apertures in the sheet metal structure.

18. A method for mounting a fingerstock EMI shielding gasket on a sheet metal structure, the fingerstock EMI shielding gasket having a generally D-shaped cross section with at least one mounting tab forming at least part of an upright portion thereof, the sheet metal structure having at least one inner tab attached thereto and at least one outer tab attached thereto, the inner and outer tabs protruding outwardly from a surface of the sheet metal structure and being aligned longitudinally in a direction parallel to an edge of the sheet metal structure, the inner and outer tabs being laterally separated, the method comprising:

sliding the fingerstock EMI shielding gasket longitudinally between the inner and outer tabs with the at least one mounting tab of the fingerstock EMI shielding gasket being positioned beneath at least one inner tab of the sheet metal structure, thereby securing the fingerstock EMI shielding gasket generally between the inner and outer tabs of the sheet metal structure;

wherein the fingerstock EMI shielding gasket includes a second mounting tab, the second mounting tab forming part of an upright portion of the generally D-shaped cross section, and wherein the sheet metal structure further includes at least one anti-snag tab oriented in the same general direction as the at least one outer tab, the at least one anti-snag tab being laterally separated from the inner and outer tabs and laterally farther from the at least one outer tab than from the at least one inner tab, and wherein sliding the fingerstock EMI shielding gasket includes positioning the second mounting tab of the fingerstock EMI shielding gasket generally beneath the at least one anti-snag tab, whereby the anti-snag tab helps hold the second mounting tab down on the surface of the sheet metal structure.

19. The method of claim 18, wherein the fingerstock EMI shielding gasket includes a second mounting tab, the second mounting tab forming part of an upright portion of the generally D-shaped cross section, and wherein sliding the fingerstock EMI shielding gasket includes:

directing the second mounting tab beneath an edge of the sheet metal structure; or positioning the second mounting tab on a surface of the sheet metal structure.

20. The method of claim 18, wherein the sheet metal structure further comprises at least one longitudinal-retention tab protruding outwardly from a surface of the sheet metal structure and being oriented laterally relative to the inner and outer tabs such that the fingerstock EMI shielding gasket may be secured against longitudinal movement between the inner and outer tabs.

\* \* \* \* \*